United States Patent
Yu et al.

(10) Patent No.: US 10,699,778 B2
(45) Date of Patent: Jun. 30, 2020

(54) STATIC RANDOM ACCESS MEMORY (SRAM) CELL AND RELATED SRAM ARRAY FOR DEEP NEURAL NETWORK AND MACHINE LEARNING APPLICATIONS

(71) Applicants: Shimeng Yu, Tempe, AZ (US); Rui Liu, Tempe, AZ (US)

(72) Inventors: Shimeng Yu, Tempe, AZ (US); Rui Liu, Tempe, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 28 days.

(21) Appl. No.: 15/961,220

(22) Filed: Apr. 24, 2018

(65) Prior Publication Data

US 2018/0315473 A1 Nov. 1, 2018

Related U.S. Application Data

(60) Provisional application No. 62/491,327, filed on Apr. 28, 2017.

(51) Int. Cl.
*G11C 11/419* (2006.01)
*G11C 11/54* (2006.01)
(Continued)

(52) U.S. Cl.
CPC ............... *G11C 11/54* (2013.01); *G06N 3/04* (2013.01); *G06N 3/063* (2013.01); *G06N 3/08* (2013.01);
(Continued)

(58) Field of Classification Search
CPC ............................ G11C 11/419; G11C 11/412
(Continued)

(56) References Cited

U.S. PATENT DOCUMENTS

| 5,568,067 A | 10/1996 | McDermott et al. |
| 5,861,762 A | 1/1999 | Sutherland |

(Continued)

OTHER PUBLICATIONS

Courbariaux, M., et al., "Binarized Neural Networks: Training Deep Neural Networks with Weights and Activations Constrained to +1 or −1," Submitted Feb. 9, 2016, Available online at: <<https://arxiv.org/pdf/1602.02830.pdf>>, 11 pages.

(Continued)

*Primary Examiner* — Jason Lappas
(74) *Attorney, Agent, or Firm* — Withrow & Terranova, P.L.L.C.

(57) ABSTRACT

A static random access memory (SRAM) bit cell and a related SRAM array are provided. In one aspect, an SRAM cell is configured to perform an XNOR function on a first input value and a second input value. In another aspect, a number of the SRAM cells can be employed to form an SRAM array for supporting deep neural network and machine learning applications. The SRAM cell is coupled to a word line(s) and an inverted word line(s) that collectively define the first input value. The SRAM cell causes a voltage and/or current difference between a bit line(s) and a complementary bit line(s) coupled to the SRAM cell. By customizing the SRAM cell to enable the XNOR function and forming a binary neural network based on the SRAM array, it is possible to effectively implement computing-in-memory (CIM) for deep neural network and machine learning applications.

12 Claims, 7 Drawing Sheets

(51) Int. Cl.
*G11C 11/418* (2006.01)
*G11C 11/412* (2006.01)
*H03K 19/20* (2006.01)
*G06N 3/08* (2006.01)
*G06N 3/063* (2006.01)
*G06N 3/04* (2006.01)
*H01L 27/11* (2006.01)
*G11C 7/10* (2006.01)

(52) U.S. Cl.
CPC .......... *G11C 7/1006* (2013.01); *G11C 11/412* (2013.01); *G11C 11/418* (2013.01); *G11C 11/419* (2013.01); *H01L 27/1104* (2013.01); *H03K 19/20* (2013.01)

(58) Field of Classification Search
USPC ........................................................ 365/154
See application file for complete search history.

(56) References Cited

U.S. PATENT DOCUMENTS

| | | | |
|---|---|---|---|
| 8,653,857 B2 | 2/2014 | Becker | |
| 9,356,598 B2 | 5/2016 | Vrudhula et al. | |
| 9,466,362 B2 | 10/2016 | Yu et al. | |
| 9,934,463 B2 | 4/2018 | Seo et al. | |
| 2009/0161410 A1* | 6/2009 | Houston | G11C 11/412 |
| | | | 365/154 |
| 2016/0189769 A1* | 6/2016 | Jeloka | G11C 11/419 |
| | | | 365/154 |
| 2019/0080755 A1 | 3/2019 | Seo et al. | |
| 2019/0370639 A1 | 12/2019 | Yu | |

OTHER PUBLICATIONS

Rastegari, M., et al., "XNOR-Net: ImageNet Classification Using Binary Convolutional Neural Networks," Submitted Aug. 2, 2016, Available online at: <<https://arxiv.org/abs/1603.05279>>, 17 pages.

Zhang, J., et al., "A Machine-learning Classifier Implemented in a Standard 6T SRAM Array," 2016 Symposium on VLSI Circuits Digest of Technical Papers, 2016, IEEE, pp. 252-253.

Frontini, L. et al., "A new XOR-based Content Addressable Memory architecture", 19th IEEE International Conference on Electronics, Circuits, and Systems (Seville, Spain, Dec. 9-12, 2012), Feb. 2013, pp. 701-704 <DOI:10.1109/ICECS.2012.6463629>.

Tang, M., "Comparison of CMOS XOR and XNOR gate design", Oregon Health & Science University, Master's Thesis, Aug. 2002 [retrieved Dec. 30, 2019], 104 pages, retrieved from the Internet: <https://scholararchive.ohsu.edu/concern/etds/qj72p7338>, <DOI:10.6083/M4765CN1>.

Vijayalakshmi, S. et al., "Content Addressable Memory Using XNOR CAM Cell", International Journal of Applied Engineering Research, 2016, vol. 11, No. 1, pp. 28-32.

Wang, J. et al., "New efficient designs for XOR and XNOR functions on the transistor level", IEEE Journal of Solid-State Circuits, Jul. 1994, vol. 29, No. 7, pp. 780-786 <DOI:10.1109/4303715>.

* cited by examiner

STATIC RANDOM ACCESS MEMORY (SRAM) CELL AND RELATED SRAM ARRAY FOR DEEP NEURAL NETWORK AND MACHINE LEARNING APPLICATIONS

RELATED APPLICATIONS

This application claims the benefit of U.S. Provisional Patent Application Ser. No. 62/491,327, filed on Apr. 28, 2017, which is incorporated herein by reference in its entirety.

FIELD OF THE DISCLOSURE

The technology of the disclosure relates generally to static random access memory (SRAM) support computing-in-memory (CIM) applications.

BACKGROUND

Deep neural networks (DNNs) typically consist of convolutional layers (CNVL) and fully connected layers (FCL). Vector-matrix multiplications involving multiply-accumulate (MAC) computation extensively exists in the CNVLs and the FCLs. High precision MAC operations impose high demands on computational resources and memory storage in the DNNs, making it challenging to implement state-of-the-art DNNs on resource-limited platforms such as mobile devices.

Binary DNNs are proposed to effectively reduce computation and storage costs with marginal accuracy degradation. Among the reported binary DNNs, XNOR-Net presents a remarkable advantage in accuracy (e.g., >17% higher in accuracy with AlexNet on ImageNet than other Binary-Net). In an XNOR-Net, both synaptic weights and neuron activations are binarized to +1 or −1 and the high-precision MAC operations are thus replaced by XNOR and bit-counting operations. However, the memory bottleneck remains in the conventional complementary metal-oxide semiconductor (CMOS) application specific integrated circuit (ASIC) accelerators. Although parallel computation has been exploited across processing-element (PE) arrays, the weights and intermediate data still require inefficient row-by-row static random access memory (SRAM) access.

Computing-in-memory (CIM) is a technique that may improve parallelism within a memory array by activating multiple rows and using analog column current to conduct multiplication and summation operations. In this regard, it may desirable to customize SRAM bit cells to enable XNOR and bit-counting operation in the XNOR-Net.

SUMMARY

Aspects disclosed in the detailed description include static random access memory (SRAM) cell and array for deep neural network and machine learning applications. In one aspect, an SRAM cell is configured to perform an XNOR function on a first input value (e.g., a binarized neuron activation) and a second input value (e.g., a binarized synaptic weight). In another aspect, a number of the SRAM cells can be employed to form an SRAM array for supporting deep neural network and machine learning applications. The SRAM cell is coupled to a word line(s) and an inverted word line(s) that collectively define the first input value. The SRAM cell is configured to cause a voltage and/or current difference between a bit line(s) and a complementary bit line(s) coupled to the SRAM cell. In examples discussed herein, the voltage and/or current difference can be sensed (e.g., by a differential sense amplifier) to help determine a binary output of the XNOR function and/or a cumulative weight of multiple SRAM cells. By customizing the SRAM cell to enable the XNOR function and forming a binary neural network based on the SRAM array, it is possible to effectively implement computing-in-memory (CIM) for deep neural network and machine learning applications.

In one aspect, an SRAM cell is provided. The SRAM cell includes at least one word line input coupled to at least one word line. The SRAM cell also includes at least one inverted word line input coupled to at least one inverted word line. The SRAM cell also includes at least one bit line input coupled to at least one bit line. The SRAM cell also includes at least one complementary bit line input coupled to at least one complementary bit line. The SRAM cell also includes at least one SRAM bit cell. The SRAM bit cell is configured to receive a first input value collectively defined by the at least one word line and the at least one inverted word line. The SRAM bit cell is also configured to perform an XNOR function based on the first input value and a second input value pre-stored in the at least one SRAM bit cell. The SRAM bit cell is also configured to cause a voltage difference between the at least one bit line and the at least one complementary bit line, wherein the voltage difference corresponds to a binary output of the XNOR function.

In another aspect, a binary neural network is provided. The binary neural network includes an SRAM array. The SRAM array includes a first number of rows and a second number of columns. Each of the first number of rows comprises a second number of SRAM cells. Each of the second number of columns comprises a first number of SRAM cells disposed in parallel. The binary neural network also includes a first number of word lines and a first number of inverted word lines coupled to the first number of rows, respectively. The binary neural network also includes a second number of bit lines and a second number of complementary bit lines coupled to the second number of columns, respectively. Each of the first number of SRAM cells and the second number of SRAM cells is configured to receive a first input value collectively defined by a respective word line among the first number of word lines and a respective inverted word line among the first number of inverted word lines. Each of the first number of SRAM cells and the second number of SRAM cells is also configured to perform an XNOR function based on the first input value and a second input value pre-stored in the SRAM bit cell. Each of the first number of SRAM cells and the second number of SRAM cells is also configured to cause a voltage difference between a respective bit line among the second number of bit lines and a respective complementary bit line among the second number of complementary bit lines corresponding to a binary output of the XNOR function.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1:
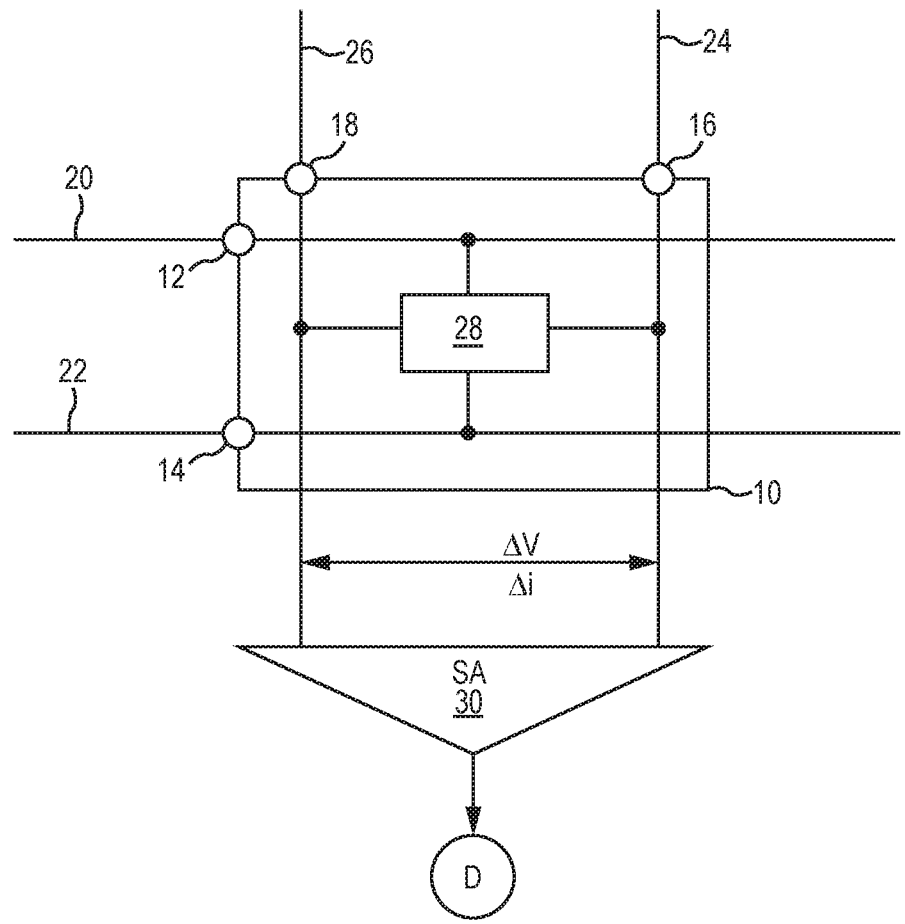
FIG. 1 is a schematic diagram of an exemplary static random access memory (SRAM) cell configured to support an XNOR function.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include static random access memory (SRAM) cell and related SRAM array for deep neural network and machine learning applications. In one aspect, a SRAM cell is configured to perform an XNOR function on a first input value (e.g., a binarized neuron activation) and a second input value (e.g., a binarized synaptic weight). In another aspect, a number of the SRAM cells can be employed to form a SRAM array for supporting deep neural network and machine learning applications. The SRAM cell is coupled to a word line(s) and an inverted word line(s) that collectively define the first input value. The SRAM cell is configured to cause a voltage and/or current difference between a bit line(s) and a complementary bit line(s) coupled to the SRAM cell. In examples discussed herein, the voltage and/or current difference can be sensed (e.g., by a differential sense amplifier) to help determine a binary output of the XNOR function and/or a cumulative weight of multiple SRAM cells. By customizing the SRAM cell to enable the XNOR function and forming a binary neural network based on the SRAM array, it is possible to effectively implement computing-in-memory (CIM) for deep neural network and machine learning applications.

In this regard, FIG. 1 is a schematic diagram of an exemplary SRAM cell 10 configured to support an XNOR function. In a non-limiting example, the XNOR function (also referred to as an "exclusive NOR" function) enabled by the SRAM cell 10 is a two-input logical equality function based on the truth table (Table 1) below.

TABLE 1

| Input A | Input B | Output of A XNOR B |
|---------|---------|--------------------|
| 0 | 0 | 1 |
| 0 | 1 | 0 |
| 1 | 0 | 0 |
| 1 | 1 | 1 |

In examples discussed herein, the SRAM cell 10 is configured to perform an XNOR function on a first input value (e.g., a binary neuron activation) and a second input value (e.g., a binary synaptic weight) to generate a binary output D. In a non-limiting example, a neuron activation and the synaptic weight in a deep neural network (e.g., an XNOR-Net) can each be binarized to positive one (+1) or negative one (−1) such that a high-precision multiply-accumulate computation (MAC) operation can be replaced by XNOR and bit-counting operations. Accordingly, the SRAM cell 10 can be adapted to operate based on the XNOR truth table (Table 2) below.

TABLE 2

| First Input Value (Neuron Activation) | Second Input Value (Synaptic Weight) | Output (D) |
|---|---|---|
| −1 | −1 | 1 |
| −1 | +1 | 0 |
| +1 | −1 | 0 |
| +1 | +1 | 1 |

The SRAM cell includes at least one word line input 12, at least one inverted word line input 14, at least one bit line input 16, and at least one complementary bit line input 18. The word line input 12, the inverted word line input 14, the bit line input 16, and the complementary bit line input 18 are coupled to a word line 20, an inverted word line 22, a bit line 24, and a complementary bit line 26, respectively.

The SRAM cell 10 includes at least one SRAM bit cell 28, which is configured to carry out the XNOR function on the first input value and the second input value to generate the binary output D based on the truth table (Table 2) above. The SRAM bit cell 28 receives the first input value (e.g., the binary neuron activation) that is collectively defined by the word line 20 and the inverted word line 22 according to the word line setting rules in Table 3 below.

TABLE 3

| Word Line (20) | Inverted Word Line (22) | First Input Value |
|---|---|---|
| Deactivated (GND) | Activated (VDD) | −1 |
| Activated (VDD) | Deactivated (GND) | +1 |

According to Table 3, the word line 20 and the inverted word line collectively define the first input value corresponding to negative binarized neuron activation (−1) when the word line 20 is deactivated (e.g., coupled to GND) and the inverted word line 22 is activated (e.g., coupled to VDD). In contrast, the word line 20 and the inverted word line collectively define the first input value corresponding to positive binarized neuron activation (+1) when the word line 20 is activated (e.g., coupled to VDD) and the inverted word line 22 is deactivated (e.g., coupled to GND). On the other hand, the SRAM bit cell 28 is configured to pre-store the second input value, which corresponds to negative binarized synaptic weight (−1) or positive binarized synaptic weight (+1), via an SRAM write operation.

The SRAM bit cell 28 carries out the XNOR function on the first input value and the second input value through an SRAM read operation. For example, the bit line 24 and the complementary bit line 26 are pre-charged to VDD prior to the SRAM read operation. During the SRAM read operation, the SRAM bit cell 28 can cause a voltage difference $\Delta v$ and/or a current difference $\Delta i$ between the bit line 24 and the complementary bit line 26. Depending on the actual combination of the first input value and the second input value, the voltage difference $\Delta v$ and the current difference $\Delta i$ can be greater than zero or less than zero.

The voltage difference $\Delta v$ and/or the current difference $\Delta i$ can be sensed by a differential sense amplifier (SA) 30 and used to extrapolate the binary output D of the XNOR function. In a non-limiting example, the binary output D can be extrapolated based on the XNOR function performed by the SRAM bit cell 28 based on Table 4 below.

TABLE 4

| First Input Value | Second Input Value | Voltage Difference ($\Delta v$) | Current Difference ($\Delta i$) | Output of XNOR Function | Extrapolated Binary Output (D) |
|---|---|---|---|---|---|
| −1 | −1 | $\Delta v > 0$ | $\Delta i < 0$ | +1 | 1 |
| −1 | +1 | $\Delta v < 0$ | $\Delta i > 0$ | −1 | 0 |
| +1 | −1 | $\Delta v < 0$ | $\Delta i > 0$ | −1 | 0 |
| +1 | +1 | $\Delta v > 0$ | $\Delta i < 0$ | +1 | 1 |

Figure 2:
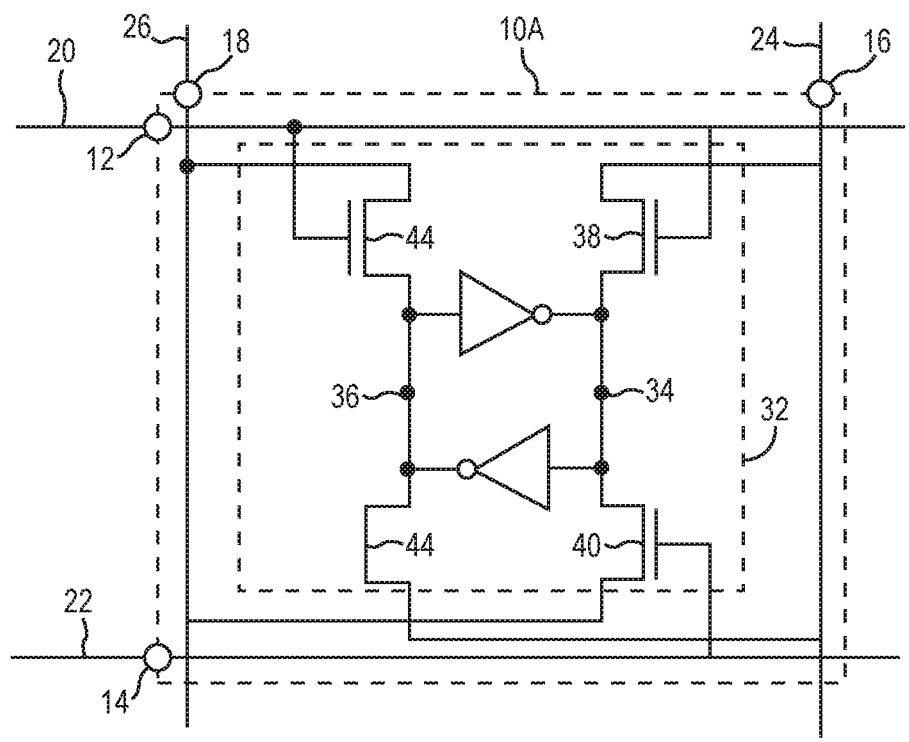
FIG. 2 is a schematic diagram of an exemplary SRAM cell implemented based on an eight-transistor (8T) SRAM bit cell.

In a non-limiting example, the SRAM bit cell 28 can be implemented based as six-transistor (6T) SRAM bit cell, seven-transistor (7T) SRAM bit cell, eight-transistor (8T) SRAM bit cell, or ten-transistor (10T) SRAM bit cell, as discussed next with reference to FIGS. 2-6. In this regard, FIG. 2 is a schematic diagram of an exemplary SRAM cell 10A implemented based on an 8T SRAM bit cell 32. Common elements between FIGS. 1 and 2 are shown therein with common element numbers and will not be re-described herein.

The 8T SRAM bit cell 32 includes a storing node 34 and an inverted storing node 36. The storing node 34 is coupled to the word line 20 and the bit line 24 via a first pass gate 38. The storing node 34 is also coupled to the inverted word line 22 and the complementary bit line 26 via a second pass gate 40. The inverted storing node 36 is coupled to the word line 20 and the complementary bit line 26 via a third pass gate 42. The inverted storing node 36 is further coupled to the inverted word line 22 and the bit line 24 via a fourth pass gate 44.

Prior to carrying out the XNOR function through SRAM read operation, the bit line 24 and the complementary bit line 26 are both pre-charged to VDD. During the SRAM read operation, if the first input value and the second input value are both −1, for example, the inverted storing node 36 is VDD and the storing node 34 is GND. As a result, the complementary bit line 26 is discharged from VDD to VDD-$\Delta V_D$ via the second pass gate 40, where $\Delta V_D$ represents the discharged voltage, while the bit line 24 remains at VDD. Accordingly, the voltage difference $\Delta v$ between the bit line 24 and the complementary bit line 26, which equals VDD−(VDD−$\Delta V_D$)=$\Delta V_D$, is positive ($\Delta v > 0$). Thus, according to Table 4 above, the output of the XNOR function equals +1 and the extrapolated binary output D will be 1. The exact amount of the voltage difference $\Delta v$ may depend on an inherent voltage drop (e.g., collector-emitter voltage drop) of the second pass gate 40.

Figure 3:
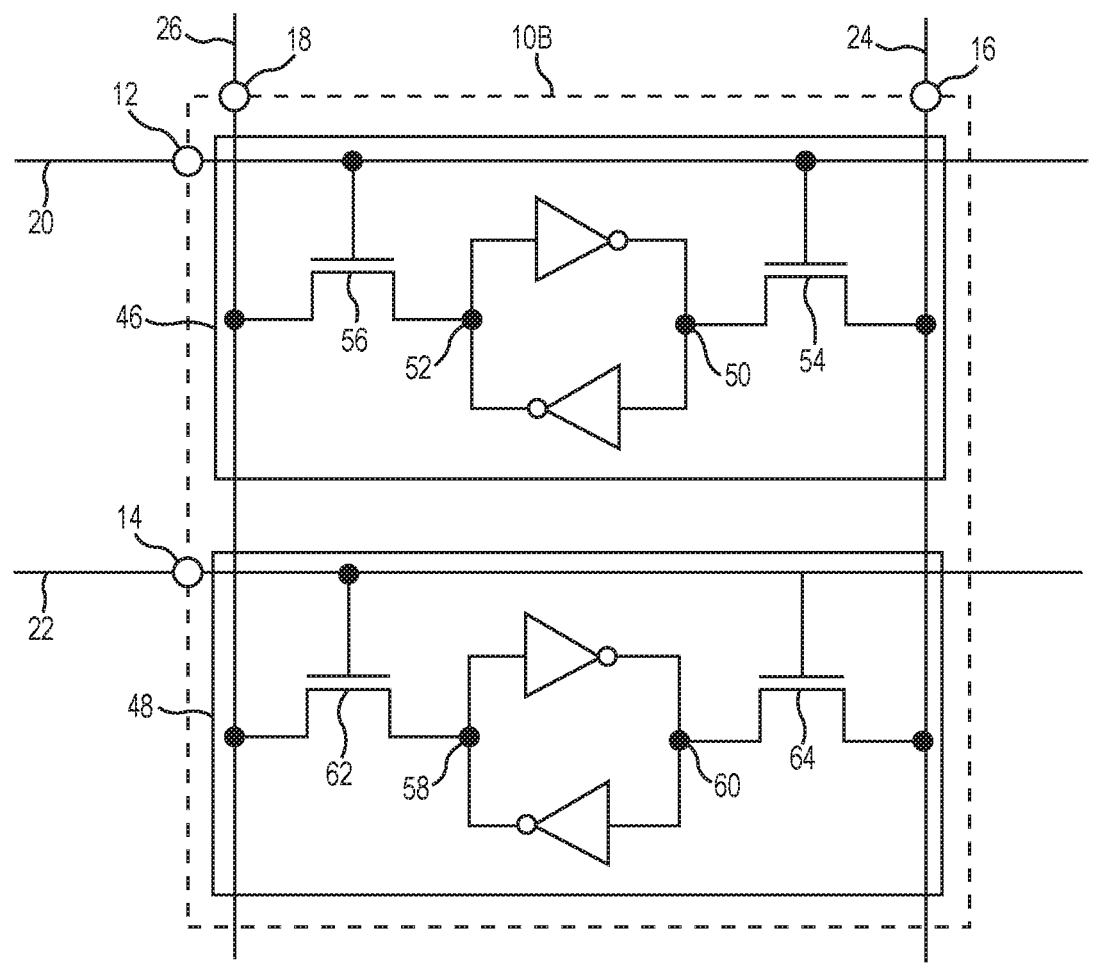
FIG. 3 is a schematic diagram of an exemplary SRAM cell implemented based on a pair of six-transistor (6T) SRAM bit cells according to one embodiment of the present disclosure.

FIG. 3 is a schematic diagram of an exemplary SRAM cell 10B configured based on a first 6T SRAM bit cell 46 and a second 6T SRAM bit cell 48 according to one embodiment of the present disclosure. Common elements between FIGS. 1 and 3 are shown therein with common element numbers and will not be re-described herein.

The first 6T SRAM bit cell 46 includes a first storing node 50 and a first inverted storing node 52. The first storing node 50 is coupled to the word line 20 and the bit line 24 via a first pass gate 54. The first inverted storing node 52 is coupled to the word line 20 and the complementary bit line 26 via a second pass gate 56.

The second 6T SRAM bit cell 48 includes a second storing node 58 and a second inverted storing node 60. The second storing node 58 is coupled to the inverted word line 22 and the complementary bit line 26 via a third pass gate 62. The second inverted storing node 60 is coupled to the inverted word line 22 and the bit line 24 via a fourth pass gate 64.

Prior to carrying out the XNOR function through SRAM read operation, the bit line 24 and the complementary bit line 26 are both pre-charged to VDD. During the SRAM read operation, if the first input value is +1 for example, the word line 20 will be activated and the inverted word line 22 will be deactivated. In this regard, if the second input value is pre-stored in the SRAM cell 10B as −1, for example, then the first storing node 50 and the second storing node 58 will be GND, and the first inverted storing node 52 and the second inverted storing node 60 will be VDD. Accordingly, the bit line 24 is discharged from VDD to VDD−$\Delta V_D$, while the complementary bit line 26 remains at VDD. Accordingly, the voltage difference $\Delta v$ between the bit line 24 and the complementary bit line 26, which equals (VDD−$\Delta V_D$)−VDD=−$\Delta V_D$, is less than zero ($\Delta v<0$). Thus, according to Table 4 above, the output of the XNOR function equals −1 and the extrapolated binary output D will be 0.

In a non-limiting example, the SRAM write operation for pre-storing the second input value +1 in the SRAM cell 10B is a two-step operation. The first step is to write the second input value into the first 6T SRAM bit cell 46. To do so, the bit line 24 and the complementary bit line 26 are pre-charged to VDD and GND, respectively, while the word line 20 is activated. In this regard, a binary "1" and a binary "0" are written into the first storing node 50 and the first inverted storing node 52 of the first 6T SRAM bit cell 46, respectively.

The second step is to write the second input value into the second 6T SRAM bit cell 48. To do so, the bit line 24 and the complementary bit line 26 are pre-charged to GND and VDD, respectively, while the inverted word line 22 is activated. In this regard, a binary "0" and a binary "1" are written into the second storing node 58 and the second inverted storing node 60 of the second 6T SRAM bit cell 48, respectively.

Figure 4:
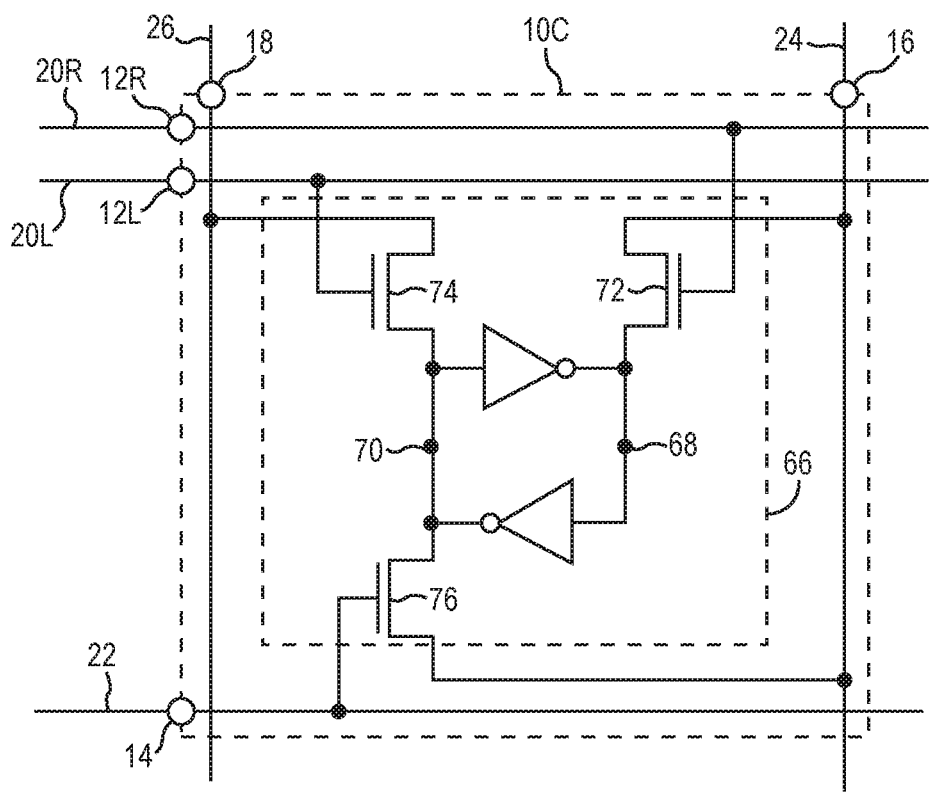
FIG. 4 is a schematic diagram of an exemplary SRAM cell implemented based on a seven-transistor (7T) SRAM bit cell.

FIG. 4 is a schematic diagram of an exemplary SRAM cell 10C implemented based on a 7T SRAM bit cell 66. Common elements between FIGS. 2 and 4 are shown therein with common element numbers and will not be re-described herein.

The SRAM cell 10C includes a first word line input 12L and a second word line input 12R coupled to a first word line 20L and a second word line 20R, respectively. The 7T SRAM bit cell 66 includes a storing node 68 and an inverted storing node 70. The storing node 68 is coupled to the bit line 24 and the second word line 20R via a first pass gate 72. The inverted storing node 70 is coupled to the complementary bit line 26 and the first word line 20L via a second pass gate 74. The inverted storing node 70 is further coupled to the bit line 24 and the inverted word line 22 via a third pass gate 76.

To write the binarized synaptic weight to the 7T SRAM bit cell 66, the first word line 20L and the second word line 20R are both activated, while the inverted word line 22 is deactivated. To perform the XNOR function in the 7T SRAM bit cell 66 through SRAM read operation, the first word line 20L is always grounded. The second word line 20R and the inverted word line 22 are activated/deactivated based on Table 3.

Figure 5:
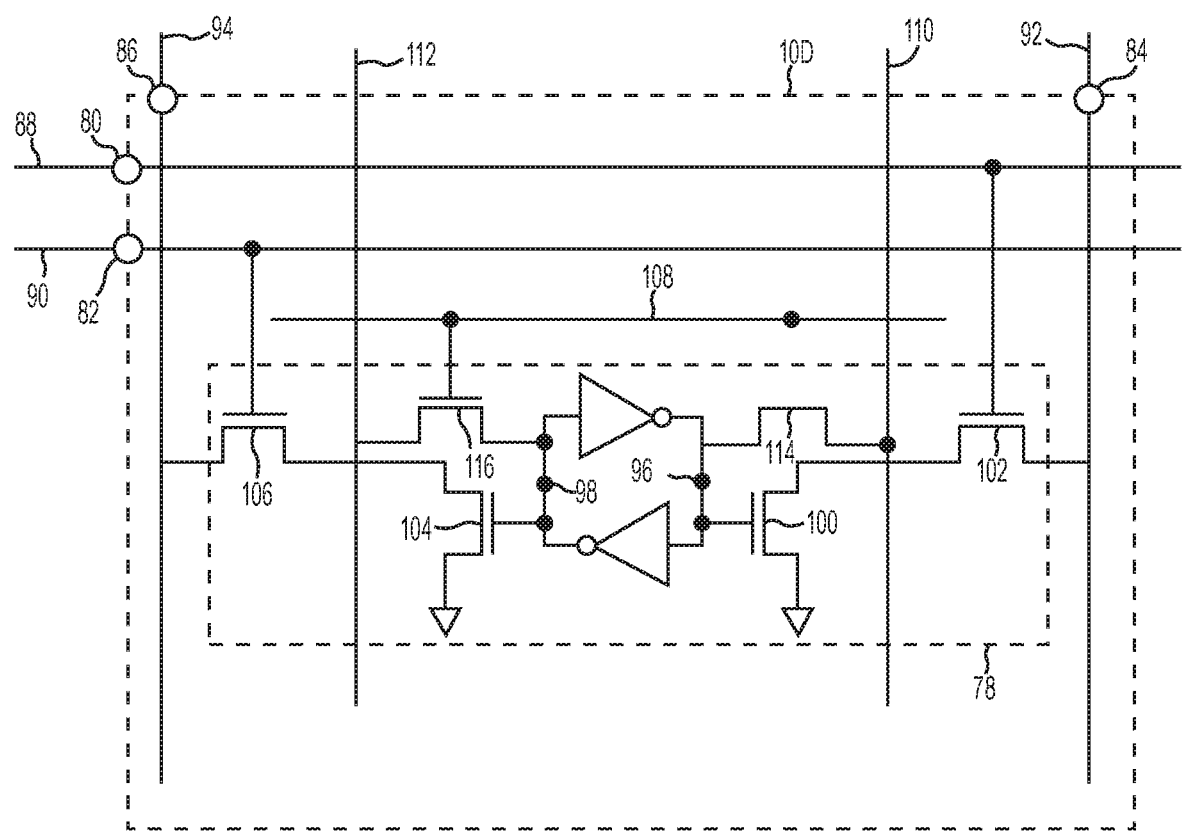
FIG. 5 is a schematic diagram of an exemplary SRAM cell implemented based on a ten-transistor (10T) SRAM bit cell.

FIG. 5 is a schematic diagram of an exemplary SRAM cell 10D implemented based on a 10T SRAM bit cell 78. The SRAM cell 10D includes a read word line input 80, an inverted word line input 82, a read bit line input 84, and a complementary read bit line 86 coupled to a read word line 88, an inverted read word line 90, a read bit line 92, and a complementary read bit line 94, respectively.

The 10T SRAM bit cell 78 includes a storing node 96 and an inverted storing node 98. The storing node 96 is coupled to the read word line 88 and the read bit line 92 via a first pass gate 100 and a second pass gate 102. The inverted storing node 98 is coupled to the inverted read word line 90 and the complementary read bit line 94 via a third pass gate 104 and a fourth pass gate 106. In a non-limiting example, the read word line 88 and the inverted read word line 90 collectively define the first input value (e.g., binary neuron activation) based on Table 3 above. During an SRAM read operation for performing the XNOR function, the 10T SRAM bit cell 78 causes the voltage difference $\Delta v$ and the current difference $\Delta i$ between the read bit line 92 and the complementary read bit line 94. Accordingly, the voltage difference $\Delta v$ and/or the current difference $\Delta i$ can be sensed to determine the output of the XNOR function and the binary output D based on Table 4.

The SRAM cell 10D further includes a write word line 108, a write bit line 110, and a complementary write bit line 112. In this regard, the storing node 96 is coupled to the write word line 108 and the write bit line 110 via a fifth pass gate 114. The inverted storing node 98 is coupled to the write word line 108 and the complementary write bit line 112 via a sixth pass gate 116. The write word line 108, the write bit line 110, and the complementary write bit line 112 may be controlled to carry out the SRAM write operation for pre-storing the second input value (e.g., binary synaptic weight) in the 10T SRAM bit cell 78. By dedicating the write word line 108, the write bit line 110, and the complementary write bit line 112 for the SRAM write operation, it may be possible to enhance stability and reliability of the 10T SRAM bit cell 78.

Figure 6:
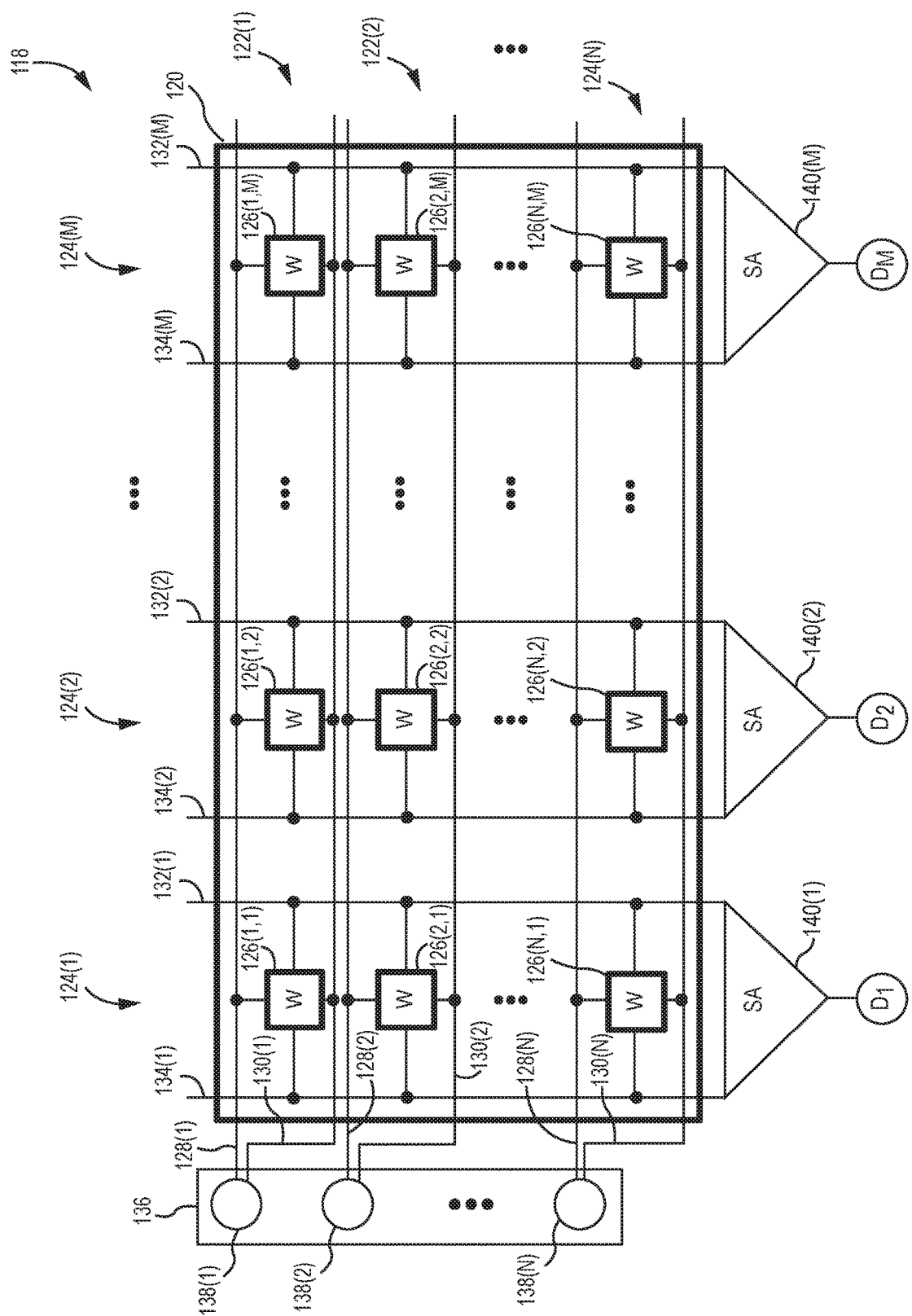
FIG. 6 is a schematic diagram of a binary neural network supported by an SRAM array formed with the SRAM cells of FIGS. 1-6.

The SRAM cell 10 of FIG. 1, the SRAM cell 10A of FIG. 2, the SRAM cell 10B of FIG. 3, the SRAM cell 10C of FIG. 4, and the SRAM cell 10D of FIG. 5 may be provided in an SRAM array for supporting deep neural network and machine learning applications. In this regard, FIG. 6 is a schematic diagram of a binary neural network 118 supported by an SRAM array 120 formed with the SRAM cell 10 of FIG. 1, the SRAM cell 10A of FIG. 2, the SRAM cell 10B of FIG. 3, the SRAM cell 10C of FIG. 4, or the SRAM cell 10D of FIG. 5.

In a non-limiting example, the SRAM array 120 is formed as an N×M (N>0, M>0) SRAM array based on the SRAM cells 10, 10A, 10B, 10C, or 10D. The SRAM array 120 includes a first number of rows 122(1)-122(N) and a second number of columns 124(1)-124(M). Each of the rows 122(1)-122(N) includes a second number of SRAM cells and each of the columns 124(1)-124(M) includes a first number of SRAM cells. In this regard, the SRAM array 120 includes a total of N×M SRAM cells 126(1,1)-126(N,M). The SRAM cells in each of the columns 124(1)-124(M) are disposed in parallel to each other. For example, the SRAM cells 126(1,1)-126(1,N) are disposed in parallel in the column 124(1).

The binary neural network 118 includes a first number of word lines 128(1)-128(N) and a first number of inverted word lines 130(1)-130(N). The word lines 128(1)-128(N) and the inverted word lines 130(1)-130(N) are coupled to the rows 122(1)-122(N), respectively. The binary neural network 118 also includes a second number of bit lines 132(1)-132(M) and a second number of complementary bit lines 134(1)-134(M). The bit lines 132(1)-132(M) and the complementary bit lines 134(1)-134(M) are coupled to the columns 124(1)-124(M), respectively.

As previously discussed, each of the SRAM cells 126(1,1)-126(N,M) is pre-stored with a respective second input value (e.g., binary synaptic weight) via the SRAM write operation. Each of the SRAM cells 126(1,1)-126(N,M) is further configured to receive a respective first input value (e.g., binary neuron activation) via a respective word line and inverted word line pair. Accordingly, each of the SRAM cells 126(1,1)-126(N,M) carries out a respective XNOR function based on the respective first input value and the respective second input value to generate a respective voltage change Δv that determines an output of the respective XNOR function.

The binary neural network 118 includes a switch matrix circuit 136. In a non-limiting example, the switch matrix circuit 136 includes a first number of vector controllers 138(1)-138(N) for controlling the word lines 128(1)-128(N) and the inverted word lines 130(1)-130(N), respectively. The vector controllers 138(1)-138(N) can be provided as microprocessors, microcontrollers, or field-programmable gate arrays (FPGAs), for example. The vector controllers 138(1)-138(N) may control the word lines 128(1)-128(N) and the inverted word lines 130(1)-130(N), respectively, based on an input vector containing the binary neuron activations for the SRAM array 120. The vector controllers 138(1)-138(N) can activate/deactivate the word lines 128(1)-128(N) and the inverted word lines 130(1)-130(N) properly based on the binary neuron activations in the input vector and in accordance to the word line setting rules in Table 3.

Depending on respective patterns of the binary neuron activations (the first input values) in the input vector and the binary synaptic weights (the second input values) pre-stored in the SRAM cells 126(1,1)-126(N,M), each of the SRAM cells 126(1,1)-126(N,M) can cause a respective voltage difference between a respective bit line and a respective complementary bit line. As a result, the SRAM cells in each of the columns 124(1)-124(M) can cause a cumulative voltage difference between the respective bit line and the respective complementary bit line. For example, each of the SRAM cells 126(1,1)-126(1,N) in the column 124(1) can cause a respective voltage difference between the bit line 132(1) and the complementary bit line 134(1). As such, it may be possible to determine the cumulative voltage difference of the column 124(1) by sensing and summing up the respective voltage difference caused by each of the SRAM cells 126(1,1)-126(1,N).

In this regard, the binary neural network 118 also includes a second number of differential sense amplifiers (SAs) 140(1)-140(M) that are coupled to the bit lines 132(1)-132(M) and the complementary bit lines 134(1)-134(M), respectively. Each of the differential SAs 140(1)-140(M) is configured to determine a cumulative voltage difference between the respective bit line and the respective complementary bit line of a respective column among the columns 124(1)-124(M). More specifically, each of the differential SAs 140(1)-140(M) is configured to determine a first total voltage change and a second total voltage change associated with the respective bit line and the respective complementary bit line of the respective column. Each of the differential SAs 140(1)-140(M) is further configured to compare the first total voltage to the second total voltage change to determine the cumulative voltage difference between the respective bit line and the respective complementary bit line. Accordingly, the differential SAs 140(1)-140(M) can determine the outputs of XNOR function for the columns 124(1)-124(M) and extrapolate a second number of binary outputs $D_1$-$D_M$ based on the outputs of XNOR function and in accordance to Table 4.

In a non-limiting example, the SRAM array 120 can be formed as a six-by-six SRAM array with six rows 122(1)-122(6) and six columns 124(1)-124(6).

Accordingly, the six-by-six SRAM array includes thirty-six SRAM cells 126(1,1)-126(36,36). Taking the column 124(1) as an example, the binary synaptic weights (the second input value) pre-stored in the SRAM cells 126(1,1)-126(1,6) are +1, −1, −1, +1, −1, and −1, respectively, and the binary neuron activations (the first input value) stored in the input vector are +1, +1, +1, −1, +1, and −1, respectively. Prior to performing the XNOR function in the SRAM cells 126(1,1)-126(1,6), the bit line 136(1) and the complementary bit line 134(1) are both pre-charged to VDD. After performing the XNOR function, the bit line 132(1) and the complementary bit line 134(1) are discharged from VDD by $4\Delta V_D$ and $2\Delta V_D$, respectively. As such, the bit line 132(1) will have a first total voltage change of VDD−$4\Delta V_D$ and the complementary bit line 134(1) will have a second total voltage change of VDD−$2\Delta V_D$. As a result, the cumulative voltage difference of the column 124(1) will be VDD−$4\Delta V_D$−(VDD−$2\Delta V_D$)=−$2\Delta V_D$. Similarly, the bit line 132(1) and the complementary bit line 134(1) also experience $4\Delta I_D$ and $2\Delta I_D$ current discharge, respectively, which lead to a cumulative current change that equals −$2\Delta I_D$, indicating that Δi<0.

Continuing with the above non-limiting example, in an alternative embodiment, it may also be possible to determine the cumulative voltage difference of the column 124(1) by determining a weighted sum of the binary outputs (D) associated with each of the SRAM cells 126(1,1)-126(1,6). Given the input vector (+1, +1, +1, −1, +1, −1) and the pre-stored weights (+1, −1, −1, +1, −1, −1), the binary outputs (D) of the SRAM cells 126(1,1)-126(1,6) will be 1, 0, 0, 0, 0, 1 according to Table 4. In this regard, the weighted sum equals two (2), indicating that a 2Δv voltage difference between the bit line 132(1) and the complementary bit line 134(1). The polarity (positive or negative) of the weighted sum may be determined by counting the number of binary 1 s respectively associated with the bit line 132(1) and the complementary bit line 134(1). If more binary 1 s are associated with the bit line 132(1) than the complementary bit line 134(1), then the polarity will be positive (+). Otherwise, the polarity will be negative (−). In the binary neural network 118, the weighted sum can be determined concurrent to performing the XNOR function based on the binary neuron activations (the first input value) and the binary synaptic weights (the second input value).

Figure 7:
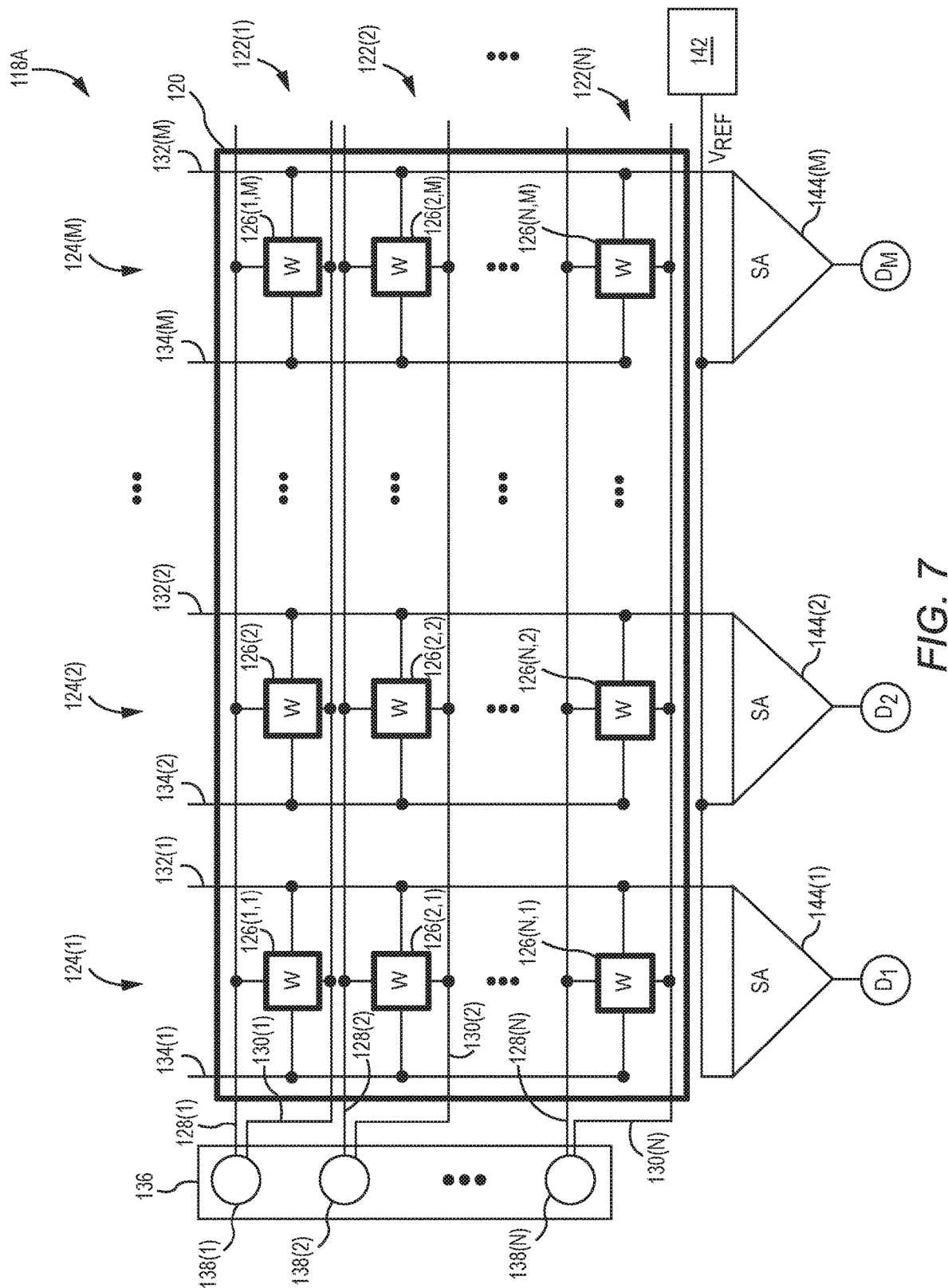
FIG. 7 is a schematic diagram of a binary neural network formed by adding a reference voltage circuit to the binary neural network of FIG. 6.

FIG. 7 is a schematic diagram of a binary neural network 118A formed by adding a reference voltage circuit 142 to the binary neural network 118 of FIG. 6. Common elements between FIGS. 6 and 7 are shown therein with common element numbers and will not be re-described herein.

The reference voltage circuit 142 is configured to generate a reference voltage $V_{REF}$, which may be set as being equal to VDD−(½N)*$\Delta V_D$, wherein N represents the first number of rows 122(1)-122(N) in the binary neural network 118A. The binary neural network 118A includes a second number of differential SAs 144(1)-144(M) that are coupled to the bit lines 132(1)-132(M) and the complementary bit lines 134(1)-134(M), respectively. Each of the differential SAs 144(1)-144(M) is coupled to the reference voltage circuit 142 to receive the reference voltage $V_{REF}$. Each of the differential SAs 144(1)-144(M) is also configured to determine a first total voltage change associated with the respective bit line and compare the first total voltage to the reference voltage $V_{REF}$ to determine the cumulative voltage difference between the respective bit line and the reference voltage $V_{REF}$. Accordingly, the differential SAs 144(1)-144(M) can determine the outputs of XNOR function for the columns 124(1)-124(M) and extrapolate the binary outputs $D_1$-$D_M$ based on Table 4. By determining the cumulative voltage difference for each of the columns 124(1)-124(M) based on the reference voltage $V_{REF}$, it may help relax voltage comparison resolutions of the differential SAs 144(1)-144(M).

Notably, the exemplary aspects discussed herein with references to FIGS. 1-7 should not be considered as being limited to using SRAM cells and/or arrays in a binary neural network. It should be appreciated that the configuration and operation principles discussed herein can be applied to other types of resistive-based non-volatile memories.

Those skilled in the art will recognize improvements and modifications to the embodiments of the present disclosure. All such improvements and modifications are considered within the scope of the concepts disclosed herein and the claims that follow.

What is claimed is:

1. A static random access memory (SRAM) cell comprising:
   at least one word line input coupled to at least one word line;
   at least one inverted word line input coupled to at least one inverted word line;
   at least one bit line input coupled to at least one bit line;
   at least one complementary bit line input coupled to at least one complementary bit line; and
   at least one SRAM bit cell configured to:
      receive a first input value collectively defined by the at least one word line and the at least one inverted word line;
      perform an XNOR function based on the first input value and a second input value pre-stored in the at least one SRAM bit cell; and
      cause a voltage difference between the at least one bit line and the at least one complementary bit line, wherein the voltage difference corresponds to a binary output of the XNOR function, wherein:
         the voltage difference is less than zero when the first input value is different from the second input value; and
         the voltage difference is greater than zero when the first input value is the same as the second input value.

2. The SRAM cell of claim 1 wherein the binary output of the XNOR function equals minus one (−1) when the voltage difference is less than zero and plus one (+1) when the voltage difference is greater than zero.

3. The SRAM cell of claim 1 wherein the first input value and the second input value represent a binarized neuron activation and a binarized synaptic weight of a deep neural network, respectively.

4. The SRAM cell of claim 1 wherein the at least one SRAM bit cell is further configured to cause a current difference between the at least one bit line and the at least one complementary bit line, wherein the current difference corresponds to the binary output of the XNOR function.

5. The SRAM cell of claim 4 wherein:
   the current difference is less than zero when the first input value is different from the second input value; and
   the current difference is greater than zero when the first input value is the same as the second input value.

6. The SRAM cell of claim 5 wherein the binary output of the XNOR function equals minus one (−1) when the current difference is less than zero and plus one (+1) when the current difference is greater than zero.

7. The SRAM cell of claim 1 wherein:
   the at least one word line and the at least one inverted word line collectively define a positive binarized neuron activation when the at least one word line and the at least one inverted word line are activated and deactivated, respectively; and
   the at least one word line and the at least one inverted word line collectively define a negative binarized neuron activation when the at least one word line and the at least one inverted word line are deactivated and activated, respectively.

8. The SRAM cell of claim 1 wherein the at least one SRAM bit cell comprises:
   a first six-transistor (6T) SRAM bit cell coupled to the at least one word line and comprising:
      a first storing node coupled to the at least one bit line via a first pass gate; and
      a first inverted storing node coupled to the at least one complementary bit line via a second pass gate; and
   a second 6T SRAM bit cell coupled to the at least one inverted word line and comprising:
      a second storing node coupled to the at least one complementary bit line via a third pass gate; and
      a second inverted storing node coupled to the at least one bit line via a fourth pass gate.

9. The SRAM cell of claim 1 wherein the at least one SRAM bit cell comprises an eight-transistor (8T) SRAM bit cell, the 8T SRAM bit cell comprising:
   a storing node coupled to the at least one bit line and the at least one word line via a first pass gate;
   the storing node further coupled to the at least one inverted word line and the at least one complementary bit line via a second pass gate;
   an inverted storing node coupled to the at least one word line and the at least one complementary bit line via a third pass gate; and
   the inverted storing node further coupled to the at least one inverted word line and the at least one bit line via a fourth pass gate.

10. The SRAM cell of claim 1 wherein:
    the at least one word line comprises a first word line and a second word line;
    the at least one inverted word line comprises an inverted word line; and
    the at least one SRAM bit cell comprises a seven-transistor (7T) SRAM bit cell, the 7T SRAM bit cell comprising:
       a storing node coupled to the at least one bit line and the second word line via a first pass gate;
       an inverted storing node coupled to the first word line and the at least one complementary bit line via a third pass gate; and
    the inverted storing node further coupled to the inverted word line and the at least one bit line via a fourth pass gate.

11. The SRAM cell of claim 1 wherein:
    the at least one word line comprises a read word line;
    the at least one inverted word line comprises an inverted read word line;
    the at least one bit line comprises a read bit line;
    the at least one complementary bit line comprises a complementary read bit line; and
    the at least one SRAM bit cell comprises a ten-transistor (10T) SRAM bit cell, the 10T SRAM bit cell comprising:

a storing node coupled to the read word line and the read bit line via a first pass gate and a second pass gate; and an inverted storing node coupled to the inverted read word line and the complementary read bit line via a third pass gate and a fourth pass gate.

12. The SRAM cell of claim 11 wherein:

the storing node is further coupled to a write word line and a write bit line via a fifth pass gate; and the inverted storing node is further coupled to the write word line and a complementary write bit line via a sixth pass gate;

wherein the write word line, the write bit line, and the complementary write bit line are configured to enable writing the second input value into the 10T SRAM bit cell.

* * * * *